US007342303B1

(12) United States Patent
Berry et al.

(10) Patent No.: US 7,342,303 B1
(45) Date of Patent: Mar. 11, 2008

(54) SEMICONDUCTOR DEVICE HAVING RF SHIELDING AND METHOD THEREFOR

(75) Inventors: Christopher J. Berry, Chandler, AZ (US); Christopher M. Scanlan, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 11/364,427

(22) Filed: Feb. 28, 2006

(51) Int. Cl.
*H01L 23/00* (2006.01)

(52) U.S. Cl. ............................. 257/703; 257/728
(58) Field of Classification Search ........ 257/782–784, 257/787–796, 728–730, 700, 659, 660, 678, 257/687, 690, 692, 693, 698; 438/106, 110–114, 438/121, 124
See application file for complete search history.

(56) References Cited

U.S. PATENT DOCUMENTS

| 5,468,999 A * | 11/1995 | Lin et al. ............... 257/784 |
| 5,557,142 A * | 9/1996 | Gilmore et al. ......... 257/659 |
| 6,423,570 B1 * | 7/2002 | Ma et al. ............... 438/106 |
| 7,030,469 B2 * | 4/2006 | Mahadevan et al. ...... 257/659 |
| 7,030,489 B2 * | 4/2006 | Kang et al. ............ 257/723 |
| 2007/0030661 A1 | 2/2007 | Morris et al. |

* cited by examiner

*Primary Examiner*—Zandra V. Smith
*Assistant Examiner*—Paul E Patton
(74) *Attorney, Agent, or Firm*—Weiss & Moy, P.C.

(57) ABSTRACT

A semiconductor device and method of manufacturing has a substrate having a plurality of metal layers. At least one metal layer is exposed on at least one side surface of the semiconductor device. A die is coupled to the substrate. A mold compound encapsulates the die and a top surface of the substrate. A conductive coating is applied to the mold compound and to at least one metal layer exposed on at least one side surface of the substrate.

20 Claims, 10 Drawing Sheets

SEMICONDUCTOR DEVICE HAVING RF SHIELDING AND METHOD THEREFOR

FIELD OF THE INVENTION

This invention relates to semiconductor devices and, more specifically, to a semiconductor device having an integrated Radio Frequency (RF) shielding which is connected to an exposed metal layer, e.g., a ground plane, formed using a multi-step saw process.

BACKGROUND OF THE INVENTION

Radio Frequency (RF) shielding is required on certain semiconductor devices in order to minimize Electro-Magnetic Interference (EMI) radiation from the semiconductor device. RF shielding is further required to prevent RF radiation from external sources from interfering with operation of the semiconductor device.

RF shielding is generally accomplished in one of three ways. A first method is to attach a metal can over the component after the component is attached to the motherboard. However, shield attach on the mother board has several problems. First, shield attach can be costly and a low yielding process. Shield attach is also problematic due to flux creep after the shield is attached and delamination and extrusion issues. External shields soldered to the motherboard further require additional board space.

An alternative to the shield attached method described above is an embedded RF shield. In an embedded shield, the metal RF shield is directly attached to the semiconductor package substrate by means of solder or a conductive adhesive. The shield may be fully embedded within the mold compound of the finished package or can be exposed after assembly. In either case, the addition of a metal shield as a component attached to the top surface of the substrate is problematic for several reasons. First, the addition of a metal shield as a component attached to the top surface of the substrate requires a significant amount of additional space on the package substrate. Second, it can be difficult to transfer mold in and around the metal shield to fully encapsulate the semiconductor package. Furthermore, external shields may also require liquid dispense encapsulation of the integrated circuit (IC), which dramatically increases the cost.

The third method is the conventional conformal shield. In this method, all of the components are placed on the substrate and the substrate, or strip, is over-molded using unit molding, or pin gate molding where individual mold caps are defined within the strip such that upward facing, exposed pads in the substrate remain exposed after the mold operation. A conductive coating is then applied to the strip such that it covers the units and also makes electrical contact to the upward facing pads. The strip is then singulated into individual units. While this technique eliminates the molding process concerns associated with the aforementioned embedded shield method, it does not eliminate the added substrate size required to form the so-called upward facing, exposed pads. Therefore, all of the existing solutions can be said to require these large contact pads on the top, or upward facing surface of the substrate.

Therefore, a need existed to provide a device and method to overcome the above problem.

SUMMARY OF THE INVENTION

A semiconductor device and method of manufacturing has a substrate having a plurality of metal layers. At least one metal layer is exposed on at least one side surface of the semiconductor device. A die is coupled to the substrate. A mold compound encapsulates the die and a top surface of the substrate. A conductive coating is applied to the mold compound and to at least one metal layer exposed on at least one side surface of the semiconductor device.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION

Figure 1:
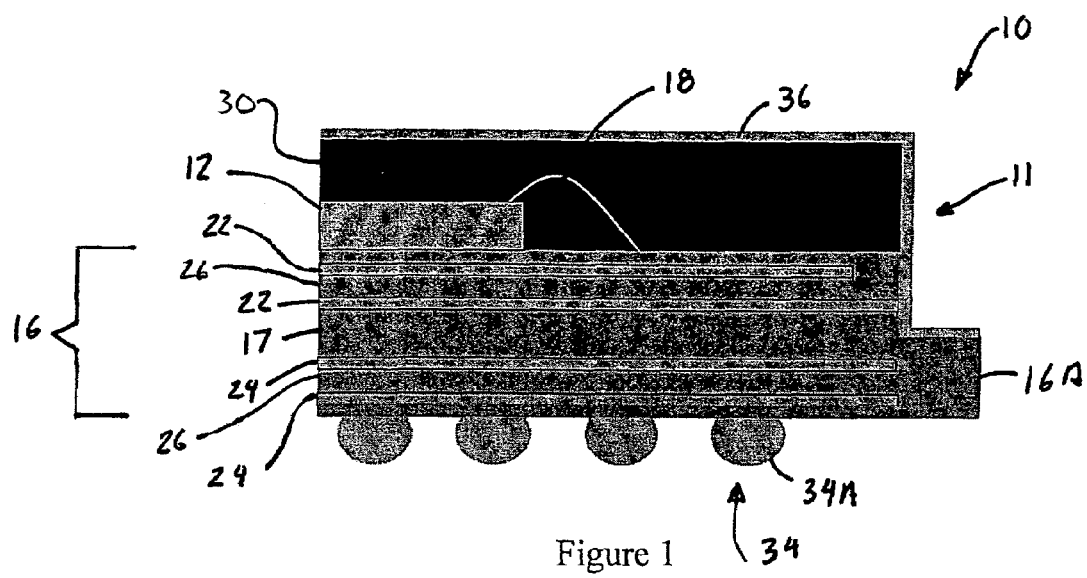
FIG. 1 is a cross-sectional side view of one embodiment of the semiconductor device of the present invention prior.

Referring to FIG. 1, a semiconductor device 10 is shown. The semiconductor device 10 may be a lead type of device, a BGA type of device, a Land Grid Array (LGA) type of device, or the like. The listing of the above should not be seen as to limit the scope of the present invention.

The semiconductor device 10 has a die 12. The die 12 may be any type of device. For example, the die 12 may be a memory device, a logic device, an ASIC device, and other like elements. It should be noted that the listing of the above types of die 12 is given as an example and should not be seen as to limit the scope of the present invention. The die 12 is coupled to a first surface of a substrate 16. An adhesive is generally used to couple the die 12 to the substrate 16. The adhesive may be an adhesive film, an epoxy, or the like. The listing of the above adhesive types should not be seen as to limit the scope of the present invention. The die 12 is electrically coupled to the substrate 16. The die 12 may be coupled to the substrate 16 through the use of wirebonds 18. Alternatively, a flip chip may be used. It should be noted that instead of a die 12, a stacked die or multi-chip module (MCM) may be used as well as a surface mounted device (SMD).

The die 12 is placed on the first surface of the substrate 16. The substrate 16 may be any one chosen from a conventional rigid PCB, a flexible PCB, and an equivalent thereof, but the kind of substrate 16 is not limited herein. The substrate 16 includes an insulation layer 17 having predetermined area and thickness. The insulation layer 17 has an approximately planar first surface and an approximately planar second surface opposing the first surface. The substrate 16 has a plurality of metal layers 22 formed on the first surface of the insulation layer 17 and a plurality of metal layers 24 formed on the second surface thereof. The substrate 16 depicted in the Figures shows two metal layers 22 formed on the first surface and two metal layers 24 formed on the second surface. However, the substrate 16 may have additional metal layers, and the number of metal layers is not limited to the number shown in the Figures. A dielectric layer 26 is generally formed between the metal layers 22 and between the metal layers 24. The dielectric layer 26 is used an insulating layer to separate two signal layers. A soldermask may then be placed over the top surface of the last metal layers 22 and 24 formed on the substrate 16. The soldermask is used to protect the metal layers 22 and 24.

A mold compound 30 is used to encapsulate the semiconductor device 10. The mold compound 30 is mainly made of non-conductive paste or film, which is coated on the top surface of the die 12 and the exposed soldermask placed over the top surface of the last metal layers 22.

As seen in FIG. 1, a side surface 11 of the semiconductor device 10 has a ledge or an "L" shape formed thereon. The side surface 11 is formed so that one of the metal layers 22 on the first surface of the insulation layer 17 is exposed. The metal layers 24 on the second surface of the insulation layer 17 are generally not exposed. In the embodiment depicted in FIG. 1, the exposed metal layer 22 is formed on the body or vertical member of the "L" shape side. All four sides of the semiconductor device 10 may be formed so that one of the metal layers 22 is exposed on each side of the semiconductor device 10.

A conductive coating 36 is then applied to the semiconductor device 10. The conductive coating 36 is used to provide RF shielding for the semiconductor device 10. The conductive coating 36 may be applied by plating, vacuum printing, vacuum deposition, insert molding, spray coating, and the like. The conductive coating 36 is applied to the top surface of the semiconductor device 10 and to the side surfaces of the semiconductor device 10. The conductive coating 36 is applied so that the conductive coating 36 will be in contact with the exposed metal layer 22. Thus, the semiconductor device 10 will have a conductive coating 36 that contacts grounded metal. If all four sides of the semiconductor device 10 expose one of the metal layers 22, the conductive coating 36 will contact ground metal on all four sides of the semiconductor device 10.

In FIG. 1, the conductive coating 36 is a conformal coating. In a conformal coating, a thin layer of the conductive coating 36 is applied to the top surface of the semiconductor device 10 and to the side surface of the semiconductor device 10. The conductive coating 36 is applied to the side surface of the semiconductor device 10 so that the body or vertical member of the "L" shape side surface of the semiconductor device 10 and the leg or horizontal member of the "L" shape side surface of the semiconductor device 10 both have a thin layer of conductive coating 36 similar in thickness to the conductive coating applied to the top surface of the semiconductor device 10.

Electrical contacts 34 are coupled to a second surface of the substrate 16. The electrical contacts 34 may be a plurality of solder balls 34A as shown in FIG. 1, a plurality of leads, or the like. If solder balls 34A are used, the solder balls 34A will be electrically coupled to the second surface of the substrate 16. In general, a reflow process may be used to couple the solder balls 34A to the second surface of the substrate 16. Alternative methods may be used to couple the leads to the substrate 16 without departing from the spirit and scope of the present invention.

Figure 2:
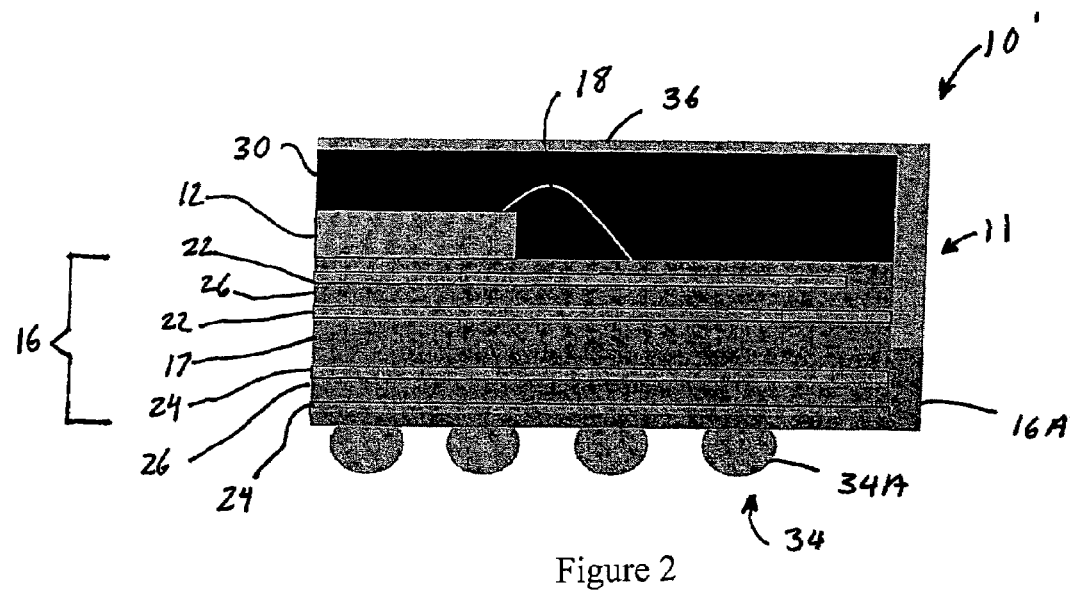
FIG. 2 is a cross-sectional side view of another embodiment of the semiconductor device of the present invention.

Referring now to FIG. 2, another embodiment of the semiconductor device 10' is shown. In this embodiment, the semiconductor device 10' is similar to that shown in FIG. 1. The main difference is that the conductive coating 36 is an over-molding coating. In the over-molding coating, the conductive coating 36 applied to the side surface will fill in the "L" shape formed on the side surface ledge of the semiconductor device 10. Thus, the conductive coating 36 applied to the side surface will be approximately planer to a section 16A of the side surface of the substrate 16.

Figure 3:
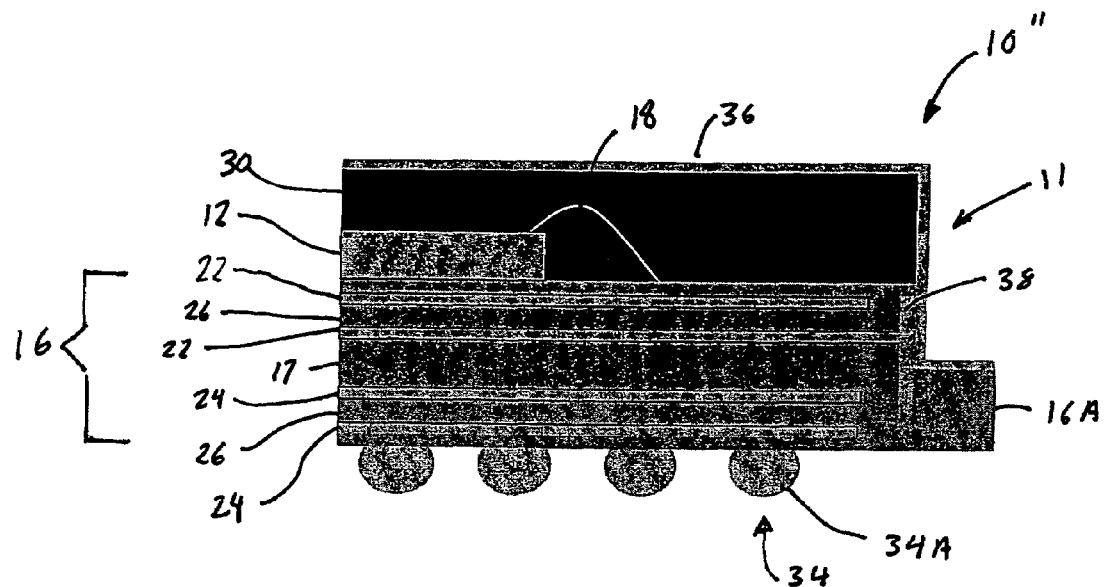
FIG. 3 is a cross-sectional side view of another embodiment of the semiconductor device of the present invention.

Referring to FIG. 3, another embodiment of the semiconductor device 10" is shown. The semiconductor device 10" is similar to that shown in FIG. 1. However, in order to increase the contact area for the conductive coating 36, one or more vias 38 may be formed in the substrate 16. The vias 38 are metal filled or metal plated and are coupled to the exposed metal layer 22. The vias 38 are generally formed on the vertical member of the "L" shape side surface of the semiconductor device 10. When the side surface of the semiconductor device 10 is cut to expose the metal layer 22, the vias 38 will also be exposed as shown in FIG. 3. Thus, when the conductive coating 36 is applied, the conductive coating 36 will be in direct contact with the exposed metal layer 22 and also to the metal layer 22 through the vias 38. Thus, the conductive coating 36 will have additional contact area with the metal layer 22 through the vias 38. In FIG. 3, the conductive coating 36 is a conformal coating. In a conformal coating, a thin layer of the conductive coating 36 is applied to the top surface of the semiconductor device 10 and to the side surface of the semiconductor device 10. The conductive coating 36 is applied to the side surface of the semiconductor device 10 so that the body or vertical member of the "L" shape side surface of the semiconductor device 10 and the leg or horizontal member of the "L" shape side surface of the semiconductor device 10 both have a thin layer of conductive coating 36 similar in thickness to the conductive coating applied to the top surface of the semiconductor device 10.

Figure 4:
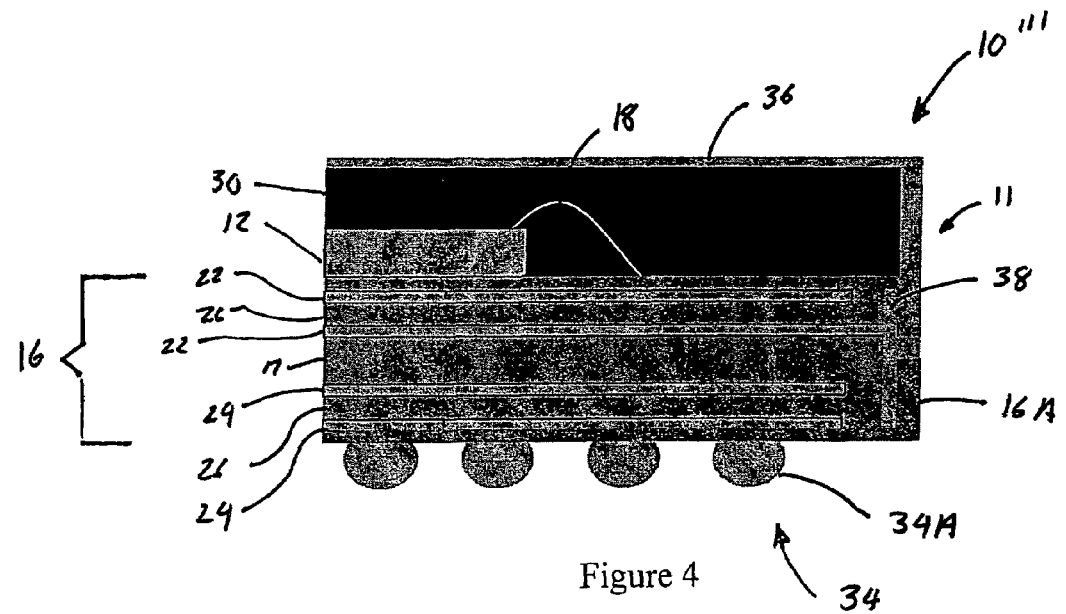
FIG. 4 is a cross-sectional side view of another embodiment of the semiconductor device of the present invention.

Referring now to FIG. 4, another embodiment of the semiconductor device 10''' is shown. The semiconductor device 10''' is similar to that shown in FIG. 3. The main difference is that the conductive coating 36 is an over-molding coating. In the over-molding coating, the conductive coating 36 applied to the side surface will fill in the "L" shape formed on the side surface ledge of the semiconductor device 10. Thus, the conductive coating 36 applied to the side surface will be approximately planer to a section 16A of the side surface of the substrate 16.

Figure 5:
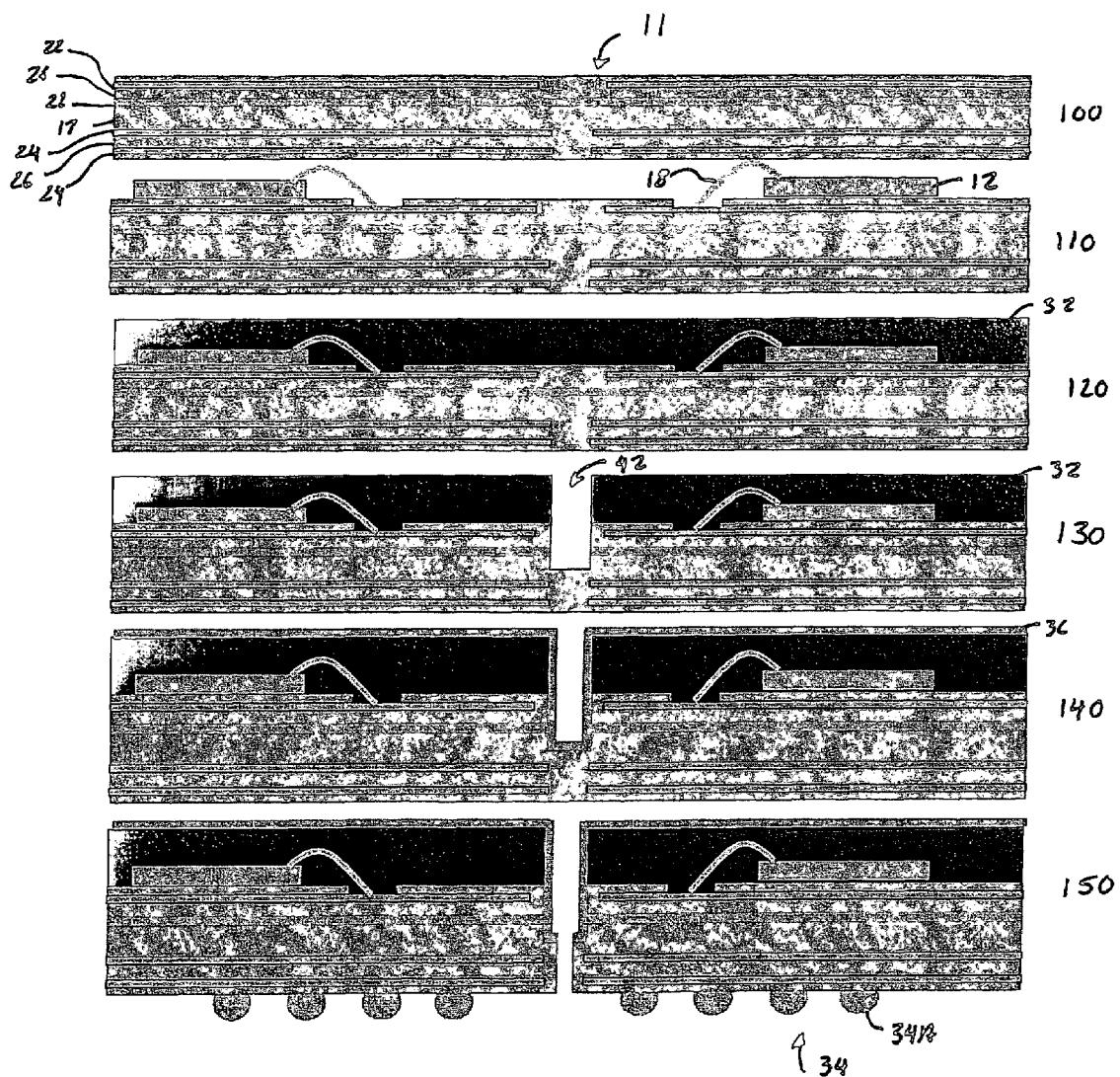
FIG. 5 is a process flow diagram depicting a method for forming the semiconductor device depicted in FIG. 1.

Referring now to FIGS. 1 and 5, a method of forming the semiconductor device 10 will be described. The semiconductor device 10 is assembled in strip fashion as shown in Step 100. Thus, a plurality of semiconductor devices 10 are formed from a single substrate strip 11. The substrate strip 11 is segmented into a plurality of rows and columns to form individual semiconductor devices 10. While FIG. 5 only shows a two dimensional view and a substrate strip 11 having only two rows, the substrate strip 11 may have a plurality of rows and columns to form individual semiconductor devices 10. The substrate strip 11 will be a fully manufactured substrate strip 11. Each segmented section of the substrate strip 11 will include an insulation layer 17 having predetermined area and thickness. A plurality of metal layers 22 are formed on the first surface of the insulation layer 17 and a plurality of metal layers 24 formed on the second surface thereof. A dielectric layer 26 is generally formed between the metal layers 22 and between the metal layers 24. The dielectric layer 26 is used an insulating layer to separate two signal layers. A soldermask may then be placed over the top surface of the last metal layers 22 and 24 formed on the substrate 16.

As shown in Step 110, a die 12 is coupled to a first surface of a substrate 16 for each module on the substrate strip 11. Some type of adhesive is generally used to couple the die 12 to the substrate 16. The die 12 is then electrically coupled to the substrate 16. The die 12 may be coupled to the substrate 16 through the use of wirebonds 18. Alternatively, a flip chip may be used.

Once each die 12 is coupled to a first surface of a substrate 16 for each module on the substrate strip 11, a mold compound 30 is then used to encapsulate the semiconductor device 10 as shown in Step 120.

Next, as shown in Step 130, a partial saw cut is made on the substrate strip 16. The partial saw cut will make a channel 42 between adjacent semiconductor devices 10. A standard package singulation saw machine may be used to make the channel 42. However, a thicker blade is used. The partial saw cut begins in the mold compound 30. The depth of the cut is controlled so that at least one metal layer 22 is sawn through, but the metal layers 24 on the second surface 18 of the substrate 12 are not exposed. All four sides of the semiconductor device 10 may be cut so that one of the metal layers 22 is exposed. It should be noted that the channel 42 may be formed in other manners. Ablation or other methods may be used without departing from the spirit and scope of the present invention.

In Step 140, a conductive coating 36 is applied to the semiconductor device 10. The conductive coating 36 may be applied by plating, vacuum printing, vacuum deposition, insert molding, spray coating, and the like. In Step 140, the conductive coating 36 is a conformal coating. In a conformal coating, a thin layer of the conductive coating 36 is applied to the top surface of the semiconductor device 10 and to the side surface of the semiconductor device 10. The conductive coating 36 is applied to the side surface of the semiconductor device 10 so that the body or vertical member of the "L" shape side surface of the semiconductor device 10 and the leg or horizontal member of the "L" shape side surface of the semiconductor device 10 both have a thin layer of conductive coating 36 similar in thickness to the conductive coating applied to the top surface of the semiconductor device 10. The conductive coating 36 is applied so that the conductive coating 36 will be in contact with the exposed metal layer 22. Thus, the semiconductor device 10 will have a conductive coating 36 that contacts grounded metal.

As shown in Step 150, electrical contacts 34 are then coupled to a second surface of the substrate 16. The electrical contacts 34 may be a plurality of solder balls 34A as shown in FIG. 5 or a plurality of leads.

The substrate strip 11 is then singulated using a blade which is thinner than the blade used to form the channel 42. It should be noted that other methods may be used to singulate the substrate strip 11 without departing from the spirit and scope of the present invention. After singulation, a semiconductor device 10 is formed that will have a conductive coating 36 that contacts grounded metal on four sides. Since a conformal coating is applied, each semiconductor device 10 will have "L" shaped edges formed after singulation.

Figure 6:
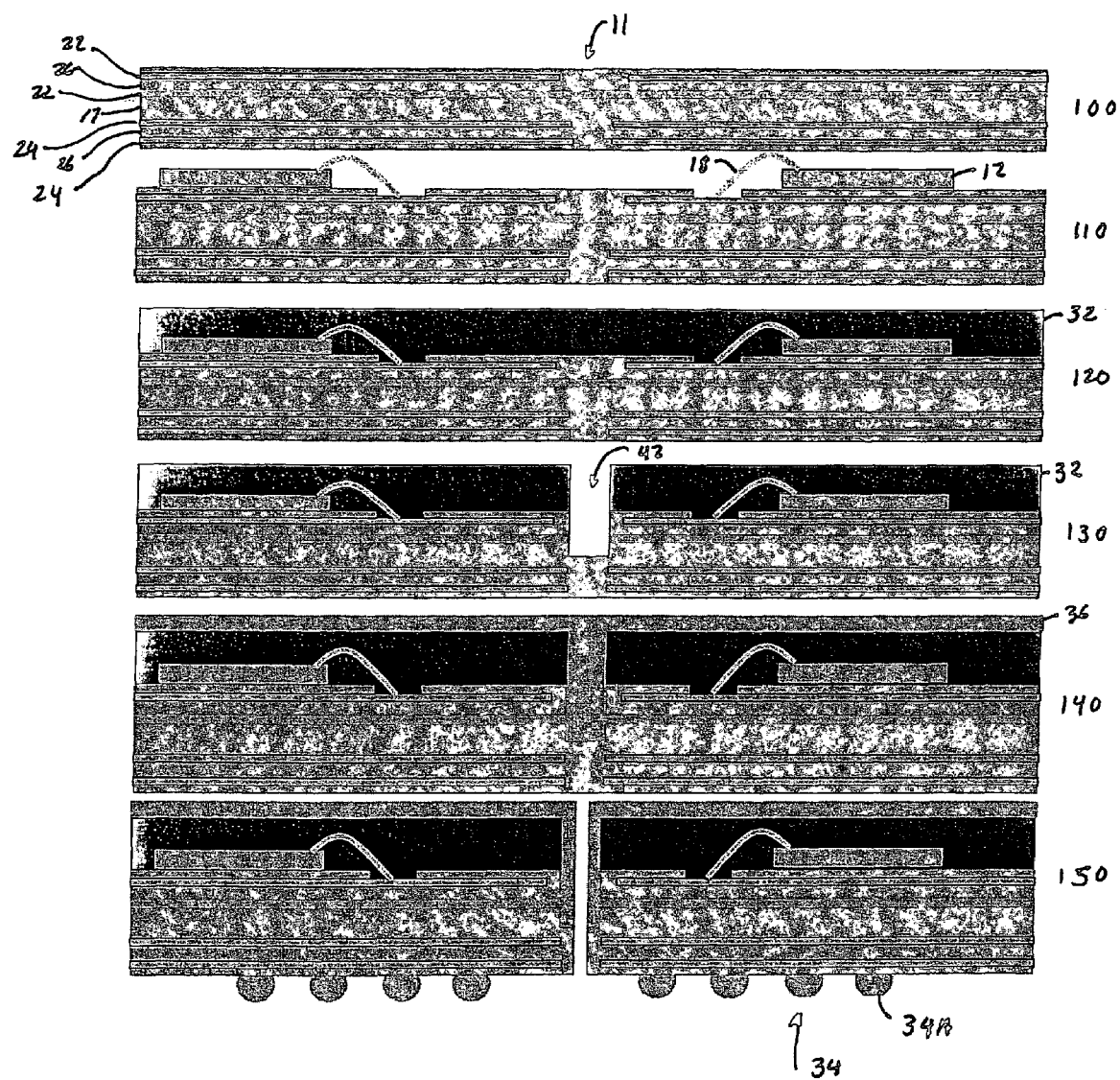
FIG. 6 is a process flow diagram depicting a method for forming the semiconductor device depicted in FIG. 2.

Referring to FIGS. 2 and 6, a method of forming the semiconductor device 10' will be described. The method for forming the semiconductor device 10' is similar to the method for forming semiconductor device 10. The semiconductor device 10' uses the same Steps 100-130 as described above. The semiconductor device 10' is assembled in strip fashion as shown in Step 100. A die 12 is coupled to a first surface of a substrate 16 for each module on the substrate strip 11 as shown in Step 110. Some type of adhesive is generally used to couple the die 12 to the substrate 16. The die 12 is then electrically coupled to the substrate 16. The die 12 may be coupled to the substrate 16 through the use of wirebonds 18. Alternatively, a flip chip may be used. A mold compound 30 is then used to encapsulate the semiconductor device 10 as shown in Step 120. Next, as shown in Step 130, a partial saw cut is made on the substrate strip 16. The partial saw cut will make a channel 42 between adjacent semiconductor devices 10.

In Step 140, a conductive coating 36 is applied to the semiconductor device 10. The conductive coating 36 may be applied by plating, vacuum printing, vacuum deposition, insert molding, spray coating, and the like. However, in Step 140, the conductive coating 36 is an over-molding coating. In the over-molding coating, the conductive coating 36 is applied to the top surface of the mold compound 30 used to encapsulate the semiconductor device 10. The conductive coating 36 is also applied to fill in the channel 42 formed between adjacent semiconductor devices 10.

As shown in Step 150, electrical contacts 34 are then coupled to a second surface of the substrate 16. The electrical contacts 34 may be a plurality of solder balls 34A as shown in FIG. 5 or a plurality of leads.

The substrate strip 11 is then singulated using a blade which is thinner than the blade used to form the channel 42. After singulation, a semiconductor device 10 is formed that will have a conductive coating 36 that contacts grounded metal. Since an over-molding coating is applied, there is no "L" shaped edges on the side of the semiconductor device 10.

Figure 7:
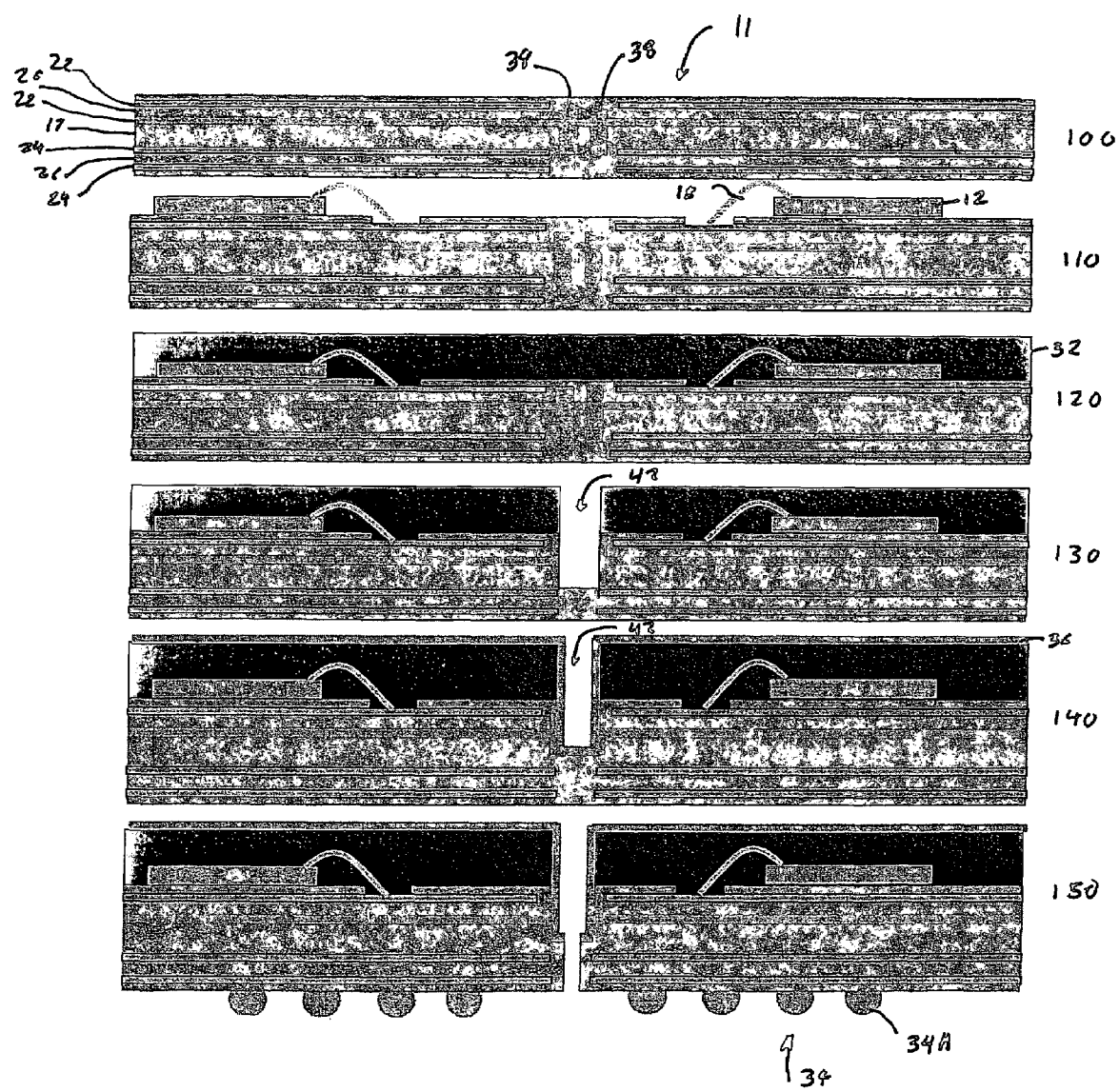
FIG. 7 is a process flow diagram depicting a method for forming the semiconductor device depicted in FIG. 3.

Referring to FIGS. 3 and 7, a method of forming the semiconductor device 10" will be described. The method for forming the semiconductor device 10" is similar to the method for forming semiconductor device 10. The main difference is that in Step 100, one or more vias 38 may be formed in the substrate 16. The vias 38 are metal filled and are coupled to the metal layer 22.

After Steps 110-120, when the a partial saw cut is made on the substrate strip 16 in Step 130, the partial saw cut will make a channel 42 between adjacent semiconductor devices 10. The vias 38 are generally formed on the vertical member of the "L" shape side surface of the semiconductor device 10. When the side surface of the semiconductor device 10 is cut to expose the metal layer 22, the vias 38 will also be exposed as shown in Step 130. Thus, when the conductive coating 36 is applied, the conductive coating 36 will be in direct contact with the exposed metal layer 22 and also to the metal layer 22 through the vias 38. Thus, the conductive coating 36 will have additional contact area with the metal layer 22 through the vias 38.

In Step 140, a conductive coating 36 is applied to the semiconductor device 10. The conductive coating 36 may be applied by plating, vacuum printing, vacuum deposition, insert molding, spray coating, and the like. In FIG. 7, the conductive coating 36 is a conformal coating. In a conformal coating, a thin layer of the conductive coating 36 is applied to the top surface of the semiconductor device 10 and to the side surface of the semiconductor device 10. The conductive coating 36 is applied to the side surface of the semiconductor device 10 so that the body or vertical member of the "L"

shape side surface of the semiconductor device 10 and the leg or horizontal member of the "L" shape side surface of the semiconductor device 10 both have a thin layer of conductive coating 36 similar in thickness to the conductive coating applied to the top surface of the semiconductor device 10. The conductive coating 36 is applied so that the conductive coating 36 will be in contact with the exposed metal layer 22 and the vias 38.

As shown in Step 150, electrical contacts 34 are then coupled to a second surface of the substrate 16. The electrical contacts 34 may be a plurality of solder balls 34A as shown in FIG. 7 or a plurality of leads.

The substrate strip 11 is then singulated using a blade which is thinner than the blade used to form the channel 42. After singulation, a semiconductor device 10 is formed that will have a conductive coating 36 that contacts grounded metal. Since a conformal coating is applied, each semiconductor device 10 will have "L" shaped edges formed after singulation.

Figure 8:
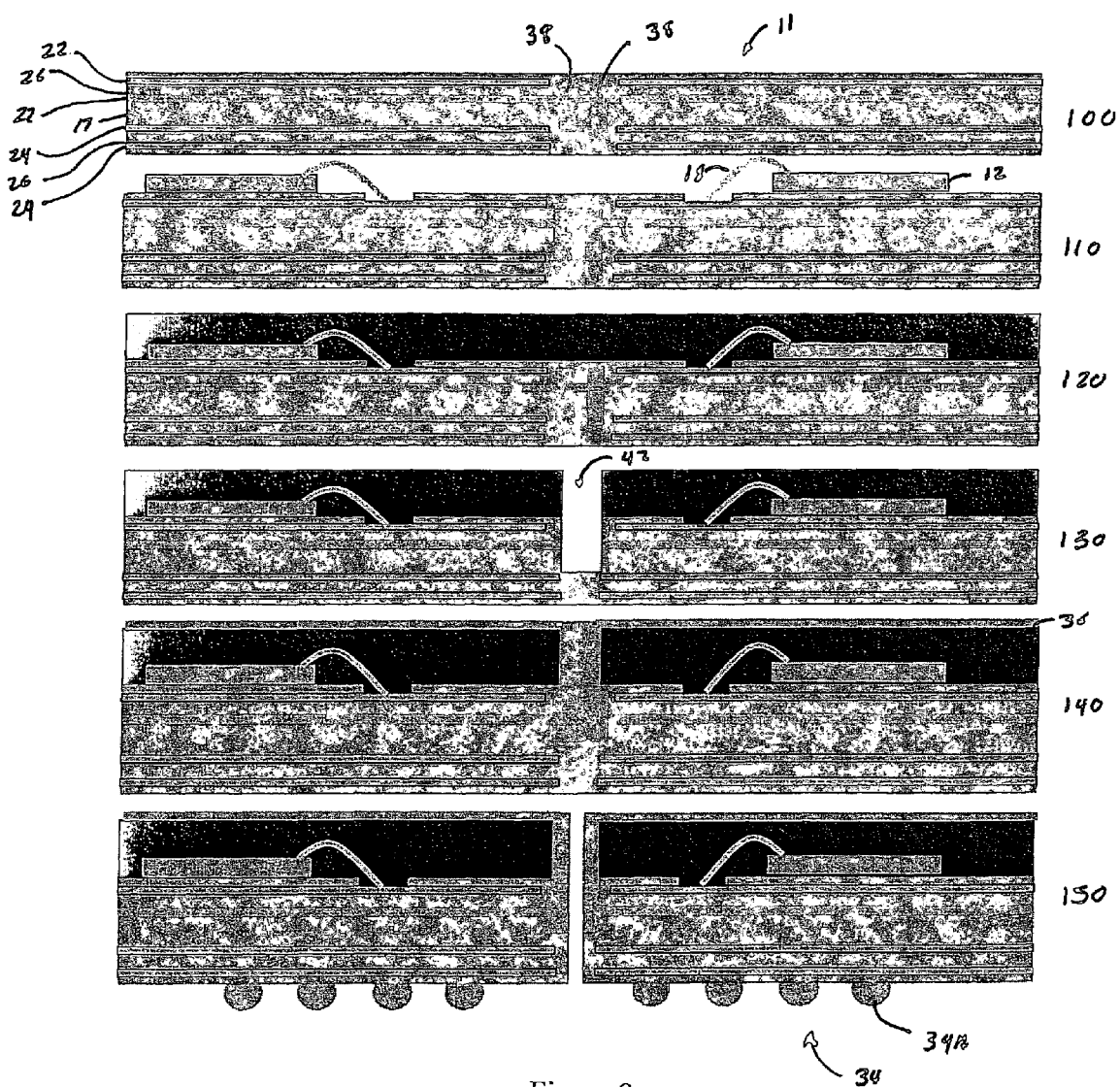
FIG. 8 is a process flow diagram depicting a method for forming the semiconductor device depicted in FIG. 4.

Referring to FIGS. 4 and 8, a method of forming the semiconductor device 10′″ will be described. The method for forming the semiconductor device 10′″ is similar to the method for forming semiconductor device 10″. Steps 100-130 are basically the same method for forming the semiconductor device 10′″ as the steps for forming semiconductor device 10″. The main difference is that in Step 140, the conductive coating 36 is an over-molding coating. In the over-molding coating, the conductive coating 36 is applied to the top surface of the mold compound 30 used to encapsulate the semiconductor device 10. The conductive coating 36 is also applied to fill in the channel 42 formed between adjacent semiconductor devices 10.

As shown in Step 150, electrical contacts 34 are then coupled to a second surface of the substrate 16. The electrical contacts 34 may be a plurality of solder balls 34A as shown in FIG. 7 or a plurality of leads.

The substrate strip 11 is then singulated using a blade which is thinner than the blade used to form the channel 42. After singulation, a semiconductor device 10 is formed that will have a conductive coating 36 that contacts grounded metal. Since an over-molding coating is applied, there is no "L" shaped edges on the side of the semiconductor device 10.

Figure 9:
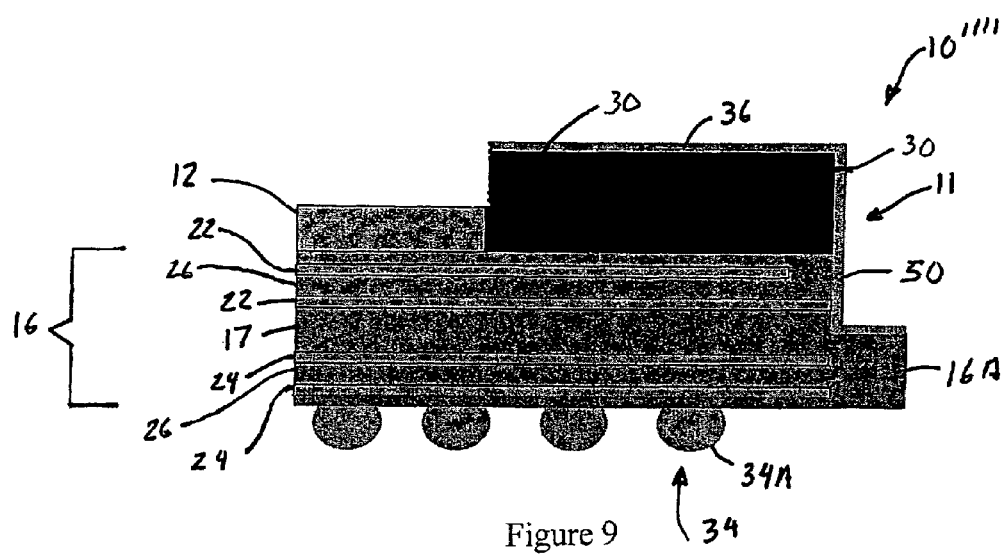
FIG. 9 is a cross-sectional side view of another embodiment of the semiconductor device of the present invention.
Figure 10:
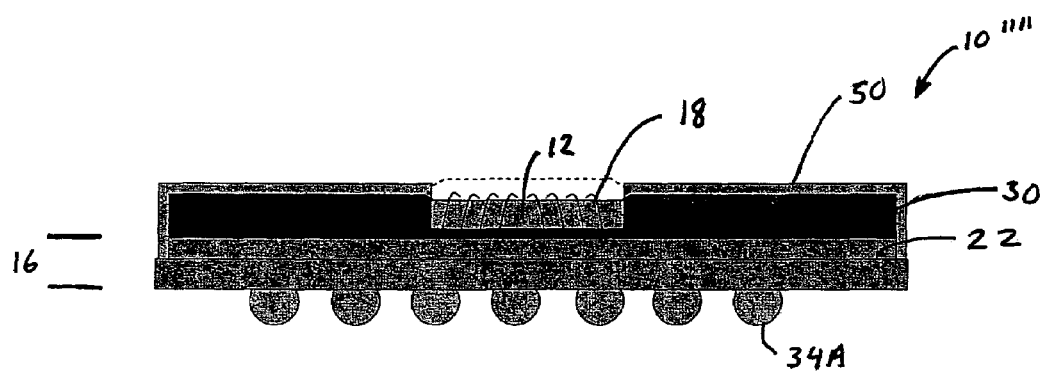
FIGS. 10-18 shows a method of forming the semiconductor device depicted in FIG. 9.
Figure 11:
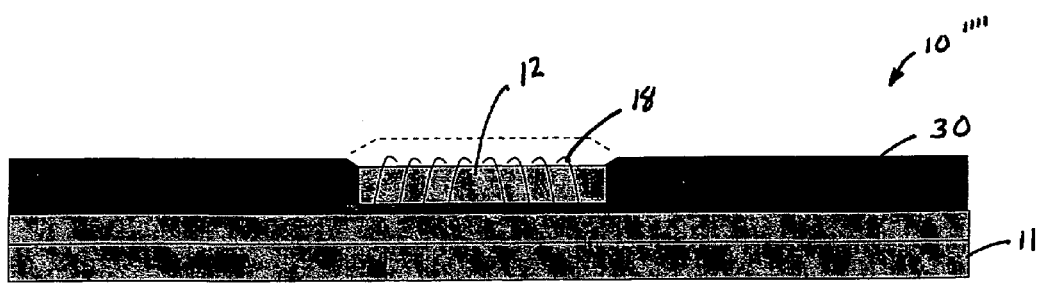

Referring now to FIGS. 9 and 10, another embodiment of the semiconductor device 10″″ is shown. The semiconductor device 10″″ is similar to that shown in the previous embodiments. The semiconductor device 10 has a die 12. The die 12 may be any type of device. For example, the die 12 may be a memory device, a logic device, an ASIC device, and other like elements. It should be noted that the listing of the above types of die 12 is given as an example and should not be seen as to limit the scope of the present invention. The die 12 is coupled to a first surface of a substrate 16. An adhesive is generally used to couple the die 12 to the substrate 16. The adhesive may be an adhesive film, an epoxy, or the like. The listing of the above adhesive types should not be seen as to limit the scope of the present invention. The die 12 is electrically coupled to the substrate 16. The die 12 may be coupled to the substrate 16 through the use of wirebonds 18. Alternatively, a flip chip may be used. It should be noted that instead of a die 12, a stacked die or multi-chip module (MCM) may be used.

The die 12 is placed on the first surface of the substrate 16. The substrate 16 may be any one chosen from a conventional rigid PCB, a flexible PCB, and an equivalent thereof, but the kind of substrate 16 is not limited herein. The substrate 16 includes an insulation layer 17 having predetermined area and thickness. The insulation layer 17 has an approximately planar first surface and an approximately planar second surface opposing the first surface. The substrate 16 has a plurality of metal layers 22 formed on the first surface of the insulation layer 17 and a plurality of metal layers 24 formed on the second surface 20 thereof. The substrate 16 depicted in the Figures shows two metal layers 22 formed on the first surface and two metal layers 24 formed on the second surface. However, the substrate 16 may have additional metal layers, and the number of metal layers is not limited to the number shown in the Figures. A dielectric layer 26 is generally formed between the metal layers 22 and between the metal layers 24. The dielectric layer 26 is used an insulating layer to separate two signal layers. A soldermask may then be placed over the top surface of the last metal layers 22 and 24 formed on the substrate 16. The soldermask is used to protect the metal layers 22 and 24.

A mold compound 30 is used to encapsulate the semiconductor device 10. The mold compound 30 is mainly made of non-conductive paste or film, which is coated on the exposed soldermask placed over the top surface of the last metal layers 22. The top surface of the die 12 is not covered by the mold compound 30 and is exposed.

As seen in FIGS. 9 and 10, a side surface 11 of the semiconductor device 10 has a ledge or an "L" shape formed thereon. The side surface 11 is formed so that one of the metal layers 22 on the first surface of the insulation layer 17 is exposed. The metal layers 24 on the second surface of the insulation layer 17 are generally not exposed. In the embodiment depicted in FIG. 1, the exposed metal layer 22 is formed on the body or vertical member of the "L" shape side. All four sides of the semiconductor device 10 may be formed so that one of the metal layers 22 is exposed on each side of the semiconductor device 10.

A plated bezel layer 50 is then formed on the semiconductor device 10. The plated bezel layer 50 covers the mold compound 30. The exposed die 12 is masked during the plating process. The plated bezel layer 50 is grounded to the substrate 16 via plating to the exposed metal layer 22 on the side surface 11 of the semiconductor device 10. The plated bezel layer 50 can be patterned such that multiple plated areas with different electrical potential can be formed.

Electrical contacts 34 are coupled to a second surface of the substrate 16. The electrical contacts 34 may be a plurality of solder balls 34A as shown in FIGS. 9 and 10 or a plurality of leads. If solder balls 34A are used, the solder balls 34A will be electrically coupled to the second surface of the substrate 16. In general, a reflow process may be used to couple the solder balls 34A to the second surface of the substrate 16. If leads are used, the leads are coupled to the substrate 16 in a different manner. Alternative methods may be used to couple the leads to the substrate 16 without departing from the spirit and scope of the present invention.

Referring now to FIGS. 9-18, a method of forming the semiconductor device 10″″ will be disclosed. The method is similar to that disclosed above. The semiconductor device 10″″ is assembled in strip fashion. Thus, a plurality of semiconductor devices 10″″ is formed from a single substrate strip 11. The substrate strip 11 is segmented into a plurality of rows and columns to form individual semiconductor devices 10. The substrate strip 11 will be a fully manufactured substrate strip 11. Each segmented section of the substrate strip 11 will include an insulation layer 17 having predetermined area and thickness. A plurality of metal layers 22 are formed on the first surface of the insulation layer 17 and a plurality of metal layers 24 formed on the second surface thereof. A dielectric layer 26 is generally formed between the metal layers 22 and between the metal layers 24. The dielectric layer 26 is used an insulating layer to separate two signal layers. A soldermask may then be placed over the top surface of the last metal layers 22 and 24 formed on the substrate 16.

A die 12 is coupled to a first surface of a substrate 16 for each module on the substrate strip 11. Some type of adhesive is generally used to couple the die 12 to the substrate 16. The die 12 is then electrically coupled to the substrate 16. The die 12 may be coupled to the substrate 16 through the use of wirebonds 18. Alternatively, a flip chip may be used.

Once each die 12 is coupled to a first surface of a substrate 16 for each module on the substrate strip 11, a mold compound 30 is then used to encapsulate the semiconductor device 10''''. The mold compound 30 is mainly made of non-conductive paste or film, which is coated on the exposed soldermask placed over the top surface of the last metal layers 22. The top surface of the die 12 is not covered by the mold compound 30 and is exposed.

Figure 12:
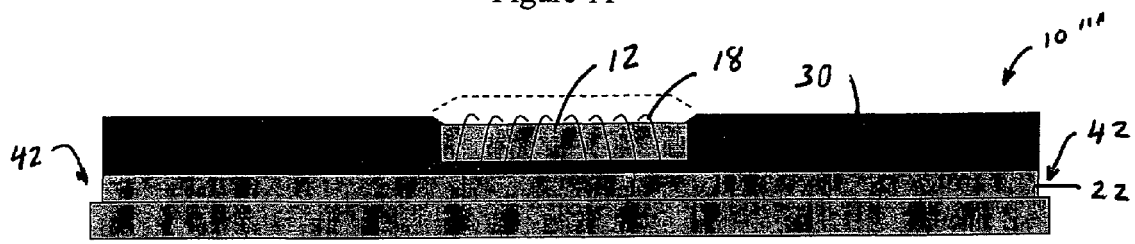

As shown in FIG. 12, a partial saw cut is made on the substrate strip 16. The partial saw cut will make a channel 42 between adjacent semiconductor devices 10''''. A standard package singulation saw machine may be used to make the channel 42. However, a thicker blade is used. The partial saw cut begins in the mold compound 30. The depth of the cut is controlled so that at least one metal layer 22 is sawn through, but the metal layers 24 on the second surface 18 of the substrate 16 are not exposed. All four sides of the semiconductor device 10'''' may be cut so that one of the metal layers 22 is exposed. It should be noted that the channel 42 may be formed in other manners. Ablation or other methods may be used without departing from the spirit and scope of the present invention.

Figure 13:
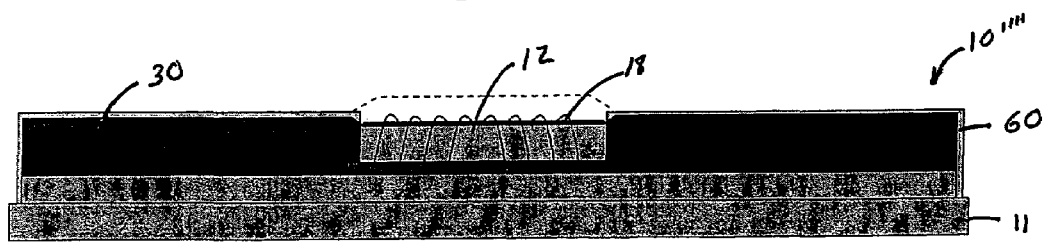

In FIG. 13, a seed layer 60 is applied to the semiconductor device 10''''. The seed layer 60 is applied to all exposed surfaces on the top of the semiconductor devices 10''''. This includes the top of the mold compound 30 and the exposed surface of the die 12. The seed layer is also applied to the side surfaces of the mold compound 30. The seed layer 60 is may be applied through a sputter process or by electroless plating. However, other processes may be used without departing from the spirit and scope of the present invention.

Figure 14:
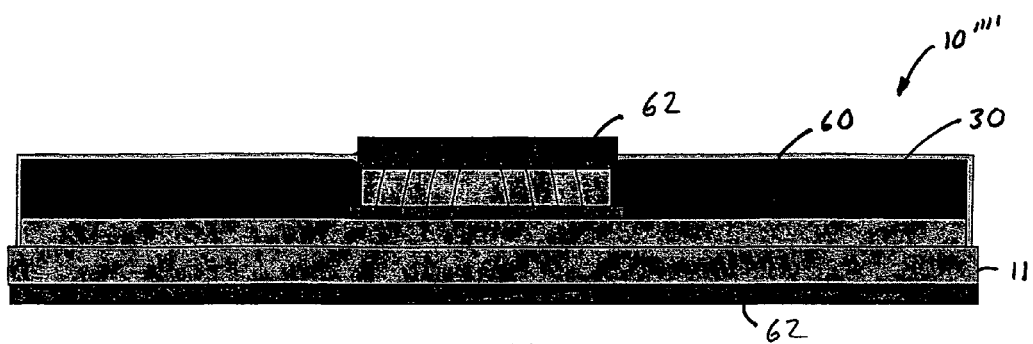

A resist layer 62 is then applied as shown in FIG. 14. The resist layer 62 is applied to the exposed surface of the die 12. The resist layer 62 is also applied to the bottom surface of the substrate 12.

Figure 15:
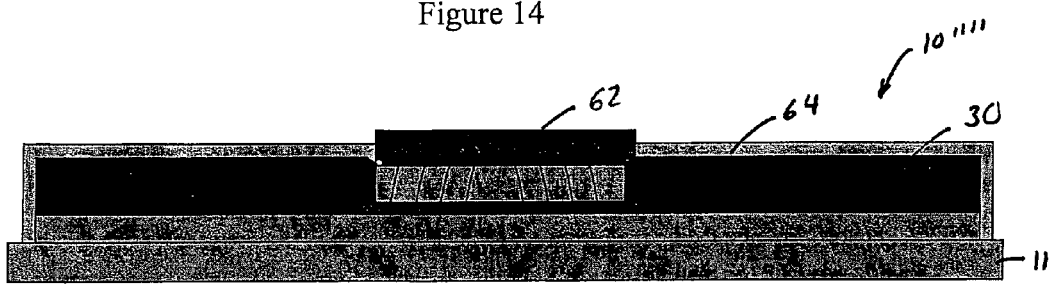

In FIG. 15, the semiconductor device 10'''' is electroplated. A thin coat of metal 64 is applied to the semiconductor device 10''''. The metal layer 64 is applied by an electrolysis process. The metal layer 64 may be copper, nickel, gold or the like. Other metals layers may be used without departing from the spirit and scope of the present invention. The metal layer 64 is applied to the area where the seed layer 60 is applied. Thus, the metal layer 64 is applied to top of the mold compound 30, and the side surfaces of the mold compound 30.

Figure 16:
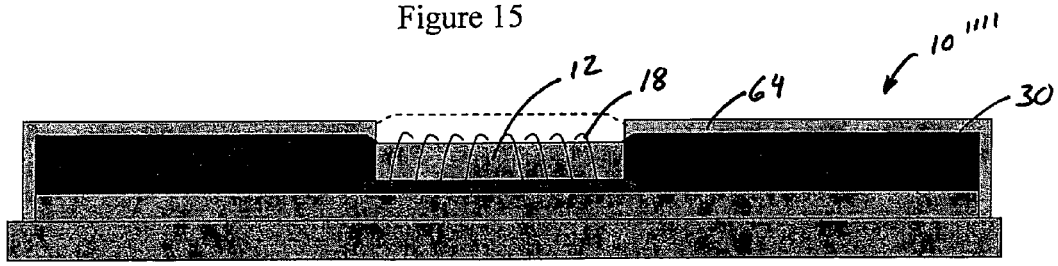

The resist layer 62 is then removed and the seed layer 60 is etched away as shown in FIG. 16. The resist layer 62 and seed layer 60 is generally strip from the exposed surface of the die 12.

Figure 17:
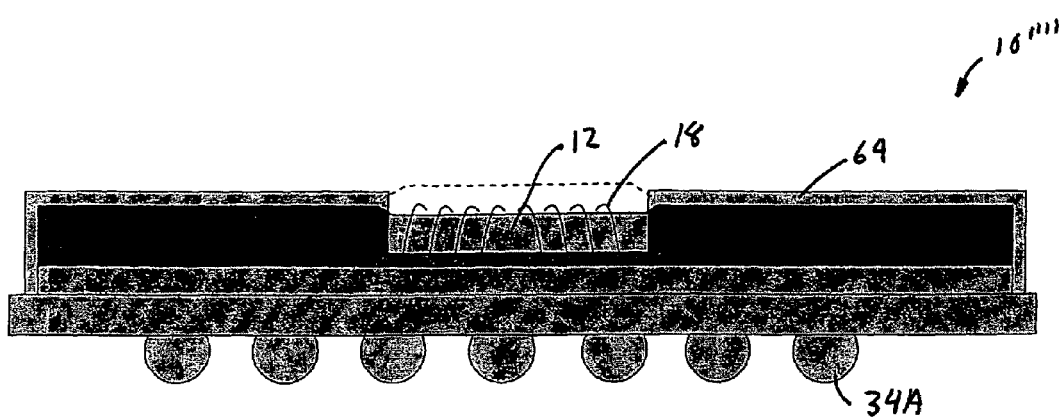
Figure 18:
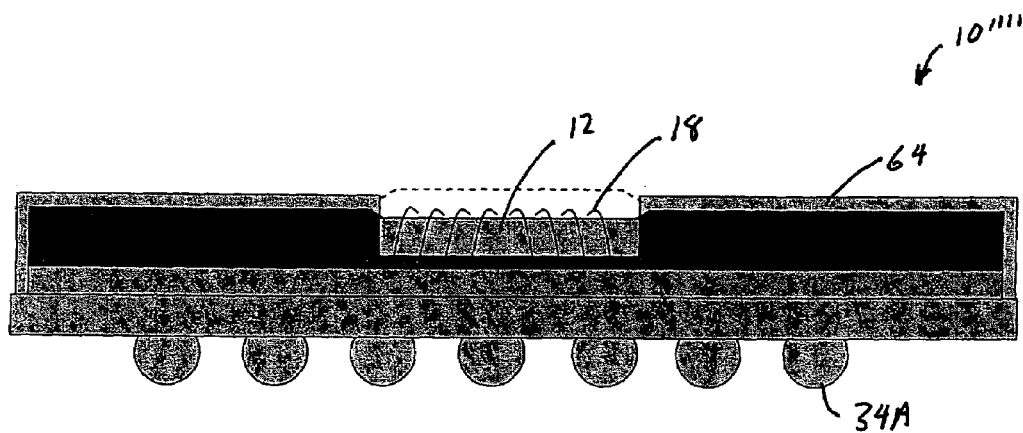

In FIG. 17 electrical contacts 34 are then coupled to a second surface of the substrate 16. The electrical contacts 34 may be a plurality of solder balls 34A as shown in FIG. 17 or a plurality of leads.

The substrate strip 11 is then singulated using a blade which is thinner than the blade used to form the channel 42. It should be noted that other methods may be used to singulate the substrate strip 11 without departing from the spirit and scope of the present invention. After singulation, a semiconductor device 10'''' is formed.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor device comprising:
   a substrate having a plurality of metal layers, wherein at least one metal layer is exposed on at least one side surface of the substrate;
   a ledge formed within the substrate;
   a die coupled to the substrate;
   a mold compound encapsulating the die and a first surface of the substrate; and
   a conductive coating applied to the mold compound and to at least one metal layer exposed on at least one side surface of the substrate.

2. A semiconductor device in accordance with claim 1 wherein the at least one metal layer is exposed on a vertical member of the ledge.

3. A semiconductor device in accordance with claim 2 wherein the conductive coating is a conformal coating.

4. A semiconductor device in accordance with claim 2 wherein the conductive coating is an over mold coating, the over mold coating approximately planar to a side surface of the ledge.

5. A semiconductor device in accordance with claim 1 further comprising at least one via formed in the substrate, the via coupled to at least one metal layer exposed on at least one side surface of the substrate, the conductive coating coupled directly to at least one metal layer exposed and to at least one metal layer exposed through the at least one via.

6. A semiconductor device in accordance with claim 5 wherein the conductive coating is a conformal coating.

7. A semiconductor device in accordance with claim 5 wherein the conductive coating is an over mold coating.

8. A semiconductor device in accordance with claim 1 further comprising contacts coupled to a second surface of the substrate.

9. A semiconductor device comprising:
   a substrate having a plurality of metal layers, wherein at least one metal layer is exposed on at least one side surface of the semiconductor device;
   a ledge formed within the substrate and exposing the at least one metal layer;
   a die coupled to the substrate;
   a mold compound encapsulating the die and a top surface of the substrate; and
   means coupled to the mold compound and to at least one metal layer exposed on at least one side surface of the semiconductor device for minimizing Electro-Magnetic Interference (EMI) radiation and Radio Frequency (RF) radiation.

10. A semiconductor device in accordance with claim 9 further comprising at least one via formed in the substrate and coupled to at least one metal layer exposed, the means coupled to at least one metal layer exposed through the at least one via.

11. A method of manufacturing a semiconductor device comprising:
    providing a substrate having a plurality of metal layers;

coupling a die to a first surface of the substrate;

encapsulating the first surface of the substrate;

cutting a surface of the semiconductor device to form a ledge within the substrate and to expose at least one metal layer on the surface of the semiconductor device; and applying a conductive coating to the mold compound and to at least one metal layer exposed on the surface of the semiconductor device.

12. The method of claim 11 further comprising:

providing a strip substrate having a plurality of modules, each module forming a semiconductor device; and coupling a die in each of the plurality of modules.

13. The method of claim 12 further comprising cutting the strip substrate between adjacent modules to form a channel so that that the at least one metal layer is exposed on at least one side surface of each of the semiconductor devices.

14. The method of claim 13 further comprising singulating each module from the strip substrate.

15. The method of claim 13 wherein applying a conductive coating comprises applying a conformal coating wherein a layer of conductive coating is applied to the top surface of the mold compound and in the channel formed between adjacent modules.

16. The method of claim 13 wherein applying a conductive coating comprises applying an over mold coating wherein the conductive coating is applied to the top surface of the mold compound and fills in the channel formed between adjacent modules.

17. The method of claim 13 further comprising forming at least one via in the substrate, the at least one via coupled to at least one metal layer which is exposed, the conductive coating coupled directly to at least one metal layer exposed and to at least one metal layer exposed through the at least one via.

18. A semiconductor device comprising:

a substrate having a plurality of metal layers, wherein at least one metal layer is exposed on at least one side surface of the substrate;

a die coupled to a first surface of the substrate;

a mold compound encapsulating a first surface of the substrate and side surface of the die, a top surface of the die remaining exposed; and an electroplate layer applied to the mold compound and to at least one metal layer exposed on at least one side surface of the substrate;

wherein the first surface of the substrate is approximately perpendicular to the at least one side surface of the substrate.

19. A method of manufacturing a semiconductor device comprising:

providing a substrate having a plurality of metal layers;

coupling a die to a first surface of the substrate;

encapsulating the first surface of the substrate and side surface of the die, a top surface of the die remaining exposed;

cutting a surface of the semiconductor device to form a ledge within the substrate and to expose at least one metal layer on surface of the semiconductor device; and applying a seed layer to the first surface of the substrate and the surface of the substrate where the at least one metal layer is exposed, the top surface of the die remaining exposed;

applying a resist layer on the top surface of the die and the bottom surface of the substrate;

applying a metal layer to the seed layer; and stripping the resist layer.

20. A semiconductor device in accordance with claim 1 wherein the ledge is formed by removing a portion of the substrate.

* * * * *